(12) United States Patent
Hulbert et al.

(10) Patent No.: US 10,169,226 B2
(45) Date of Patent: Jan. 1, 2019

(54) PERSISTENT CONTENT IN NONVOLATILE MEMORY

(71) Applicant: Micron Technology, Inc., Boise, ID (US)

(72) Inventors: Jared E. Hulbert, Cameron Park, CA (US); John C. Rudelic, Folsom, CA (US); Hongyu Wang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 15/393,919

(22) Filed: Dec. 29, 2016

(65) Prior Publication Data

US 2017/0109275 A1   Apr. 20, 2017

Related U.S. Application Data

(63) Continuation of application No. 14/848,159, filed on Sep. 8, 2015, now Pat. No. 9,563,554, which is a
(Continued)

(51) Int. Cl.
| | |
|---|---|
| G06F 12/08 | (2016.01) |
| G06F 12/02 | (2006.01) |
| G06F 9/50 | (2006.01) |
| G06F 12/0888 | (2016.01) |
| G06F 3/06 | (2006.01) |
| G06F 12/0804 | (2016.01) |
| G06F 12/1009 | (2016.01) |
| G11C 11/56 | (2006.01) |
| G11C 13/00 | (2006.01) |
| G11C 16/04 | (2006.01) |
| G11C 15/04 | (2006.01) |

(52) U.S. Cl.
CPC ........ *G06F 12/0246* (2013.01); *G06F 3/0604* (2013.01); *G06F 3/0631* (2013.01); *G06F 3/0647* (2013.01); *G06F 3/0665* (2013.01); *G06F 3/0673* (2013.01); *G06F 9/5016* (2013.01); *G06F 12/0804* (2013.01); *G06F 12/0888* (2013.01); *G06F 12/1009* (2013.01); *G06F 2212/1044* (2013.01); *G06F 2212/2022* (2013.01); *G06F 2212/604* (2013.01); *G06F 2212/7202* (2013.01); *G11C 11/5621* (2013.01); *G11C 13/0004* (2013.01); *G11C 15/046* (2013.01); *G11C 16/0408* (2013.01); *G11C 2211/5641* (2013.01)

(58) Field of Classification Search
CPC .... G06F 3/0604; G06F 3/0631; G06F 3/0647; G06F 3/0665; G06F 3/0685; G06F 12/0246; G06F 12/0804; G06F 12/0888; G06F 12/1009; G06F 2212/1044; G06F 2212/2022; G06F 2212/604; G06F 2212/7202
USPC ......................................... 711/103, 162, 206
See application file for complete search history.

(56) References Cited

U.S. PATENT DOCUMENTS

| | | |
|---|---|---|
| 4,814,971 A | 3/1989 | Thatte |
| 6,941,410 B1 * | 9/2005 | Traversat ............. G06F 9/4493 711/6 |

(Continued)

*Primary Examiner* — Gary J Portka
(74) *Attorney, Agent, or Firm* — Dorsey & Whitney LLP

(57) ABSTRACT

Applications may request persistent storage in nonvolatile memory. The persistent storage is maintained across power events and application instantiations. Persistent storage may be maintained by systems with or without memory management units.

20 Claims, 6 Drawing Sheets

Related U.S. Application Data continuation of application No. 12/638,950, filed on Dec. 15, 2009, now Pat. No. 9,128,762.

(56) References Cited

U.S. PATENT DOCUMENTS

| | | |
|---|---|---|
| 6,976,137 B2 | 12/2005 | Ouren et al. |
| 7,136,982 B2 | 11/2006 | Britt, Jr. |
| 7,996,638 B2 | 8/2011 | Robles |
| 8,458,433 B2 | 6/2013 | Barsness et al. |
| 9,128,762 B2 | 9/2015 | Hulbert et al. |
| 2003/0041222 A1 | 2/2003 | Akey |
| 2005/0144610 A1 | 6/2005 | Zenz |
| 2006/0101192 A1 | 5/2006 | Zilavy |
| 2010/0161887 A1* | 6/2010 | Nakazumi ............ G06F 12/0246 711/103 |
| 2012/0239853 A1* | 9/2012 | Moshayedi ......... G06F 11/1441 711/103 |
| 2015/0378889 A1 | 12/2015 | Hulbert et al. |

\* cited by examiner

PERSISTENT CONTENT IN NONVOLATILE MEMORY

CROSS-REFERENCE TO RELATED APPLICATIONS(S)

This application is a continuation application of U.S. application Ser. No. 14/848,159, filed Sep. 8, 2015, which is a continuation of U.S. application Ser. No. 12/638,950, filed Dec. 15, 2009, issued as U.S. Pat. No. 9,128,762 on Sep. 8, 2015. These applications and patents are hereby incorporated by reference, in their entirety, for any purpose.

TECHNICAL FIELD

The present invention relates generally to data storage in memory devices, and more specifically to data storage in nonvolatile memory.

BACKGROUND

Many electronic devices store data in both volatile memory and nonvolatile memory. Volatile memory is memory that loses stored information when power is lost, while nonvolatile memory is memory that retains information even when power is lost. Volatile memory such as random access memory (RAM) is generally faster than nonvolatile memory such as FLASH memory. As small inexpensive electronic devices (e.g., cell phones, smartphones, media players) become more feature packed, the desire for increased memory resources has also grown.

BRIEF DESCRIPTION OF THE DRAWINGS

Embodiments of the invention are illustrated by way of example and not limitation in the figures of the accompanying drawings, in which like reference numerals indicate similar elements and in which:

FIGS. 7 and 8 show flow diagrams in accordance with various embodiments of the present invention.

DESCRIPTION OF EMBODIMENTS

Embodiments of the invention provide a method and system for utilizing nonvolatile memory for persistent data storage. Application programs can request that data objects be made persistent by storing them in nonvolatile memory. Some embodiments include virtual memory, and other embodiments do not include virtual memory.

Figure 1:
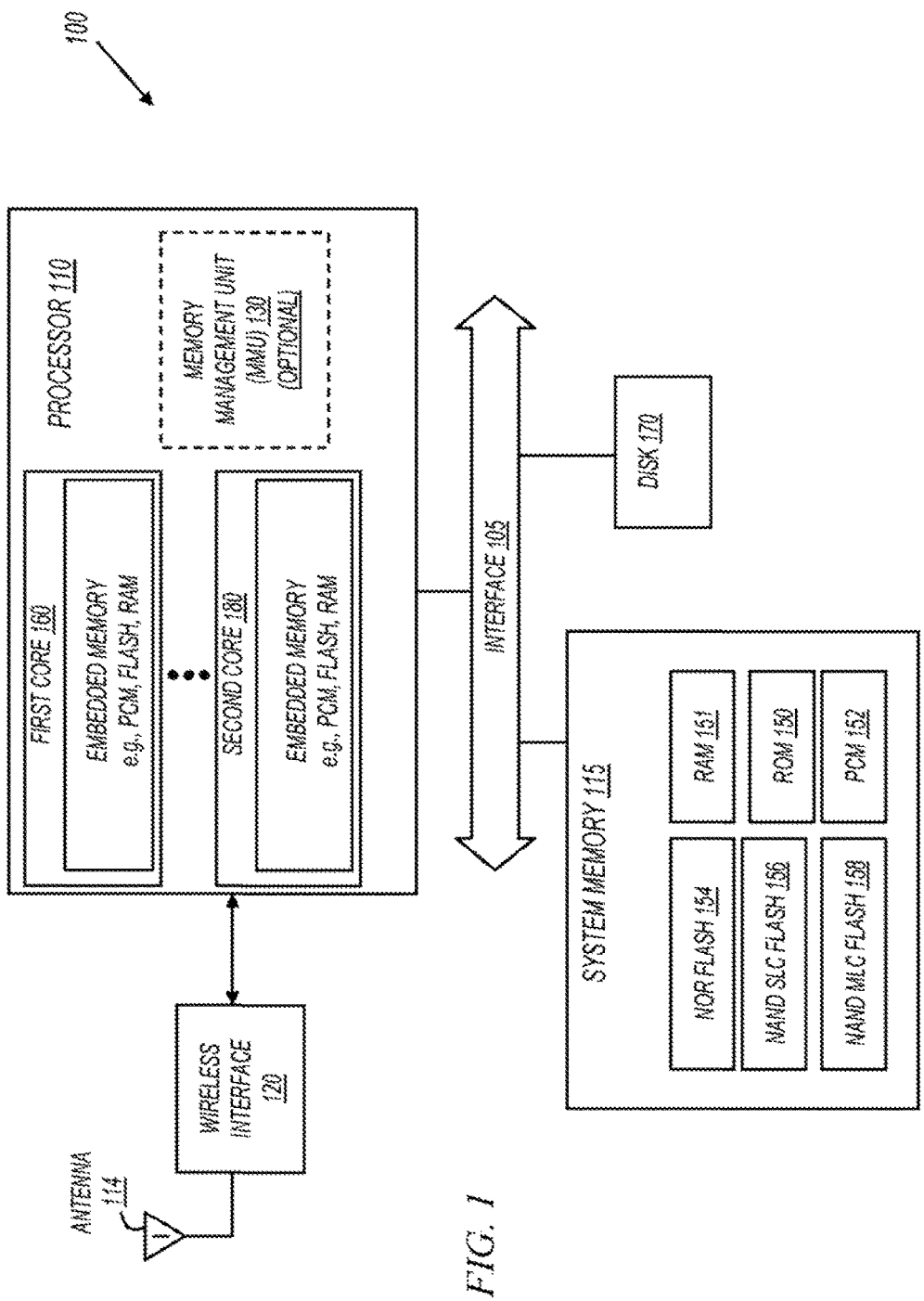
FIG. 1 shows an electronic system in accordance with various embodiments of the invention.

FIG. 1 shows a system 100 in accordance with various embodiments of the invention. System 100 may be any type of system with memory. For example, system 100 may be a mobile phone with volatile and nonvolatile memory. Also for example, system 100 may be a global positioning system (GPS) receiver or a portable media player with volatile and nonvolatile memory. Another example of system 100 is a computing device such as a server, desktop PC, notebook, netbook, or computing appliance. System 100 may be any type of device without departing from the scope of the present invention.

In some embodiments, system 100 has a wireless interface 120. Wireless interface 120 is coupled to antenna 114 to allow system 100 to communicate with other over-the-air communication devices. As such, system 100 may operate as a cellular device or a device that operates in wireless networks such as, for example, Wireless Local Area Networks (WLANs), WiMax and Mobile WiMax based systems, Wideband Code Division Multiple Access (WCDMA), and Global System for Mobile Communications (GSM) networks, any of which may or may not operate in accordance with one or more standards. The various embodiments of the invention are not limited to operate in the above network types: this is simply a list of examples. It should be understood that the scope of the present invention is not limited by the types of, the number of, or the frequency of the communication protocols that may be used by system 100. Embodiments are not, however, limited to wireless communication embodiments. Other non-wireless applications can use the various embodiments of the invention.

System 100 includes processor 110 coupled to interlace 105. Interface 105 provides communication between processor 110 and the various other devices coupled to interface 105. For example, processor 110 may communicate with memory devices in system memory 115, as well as disk 170. Interface 105 can include serial and/or parallel buses to share information along with control signal lines to be used to provide handshaking between processor 110 and the various other devices coupled to interface 105.

System memory 115 may include one or more different types of memory and may include both volatile (e.g., random access memory (RAM) 151) and nonvolatile memory read only memory (ROM) 150, phase change memory (PCM) 152, NOR FLASH memory 154, NAND single level cell (SLC) memory 156, and NAND multi-level cell (MLC) memory 158). These memory types are listed as examples, and this list is not meant to be exclusive. For example, some embodiments may include Qvonic Unified Memory (OUM), Chalcogenide Random Access Memory (C-RAM), Magnetic Random Access Memory (MRAM), Ferroelectric Random Access Memory (FRAM), Static Random Access Memory (SRAM), Dynamic Random Access Memory (DRAM), or any other type of storage device.

Processor 110 includes at least one core 160, 180, and each core may include memory. For example, first core 160 may include volatile or nonvolatile memory such as PCM, FLASH, or RAM. Each core may include any combination of different types of memory without departing from the scope of the present invention. Processor 110 may execute instructions from any suitable memory within system 100. For example, any of the memory devices within system memory 115 may be considered a computer-readable medium that has instructions stored that when accessed cause processor 110 to perform embodiments of the invention.

In some embodiments, processor 110 also includes an integral memory management unit (MMU) 130. In some embodiments, MMU 130 is a separate device. Memory management unit 130 is a hardware device or circuit that is responsible for handling accesses to memory requested by processor 110. When present, memory management unit 130 supports virtual memory and paging by translating virtual addresses into physical addresses.

Nonvolatile memory present in system 100 may provide persistent storage for applications. For example, NOR FLASH memory 154 or PCM memory 152 may be used to stare data that remains persistent between instantiations of a software application. In various embodiments of the present invention, an application can request persistent storage for data that it wishes to remain persistent. For example, a web browser application may request persistent storage for state data such as viewing history. Once an application requests persistent storage, any data may be stored in the persistent storage.

In some embodiments, persistent storage in nonvolatile memory is available to applications each time they start up. For example, persistent storage may be available to an application across instantiations of the applications as well as across power events.

Figure 2:
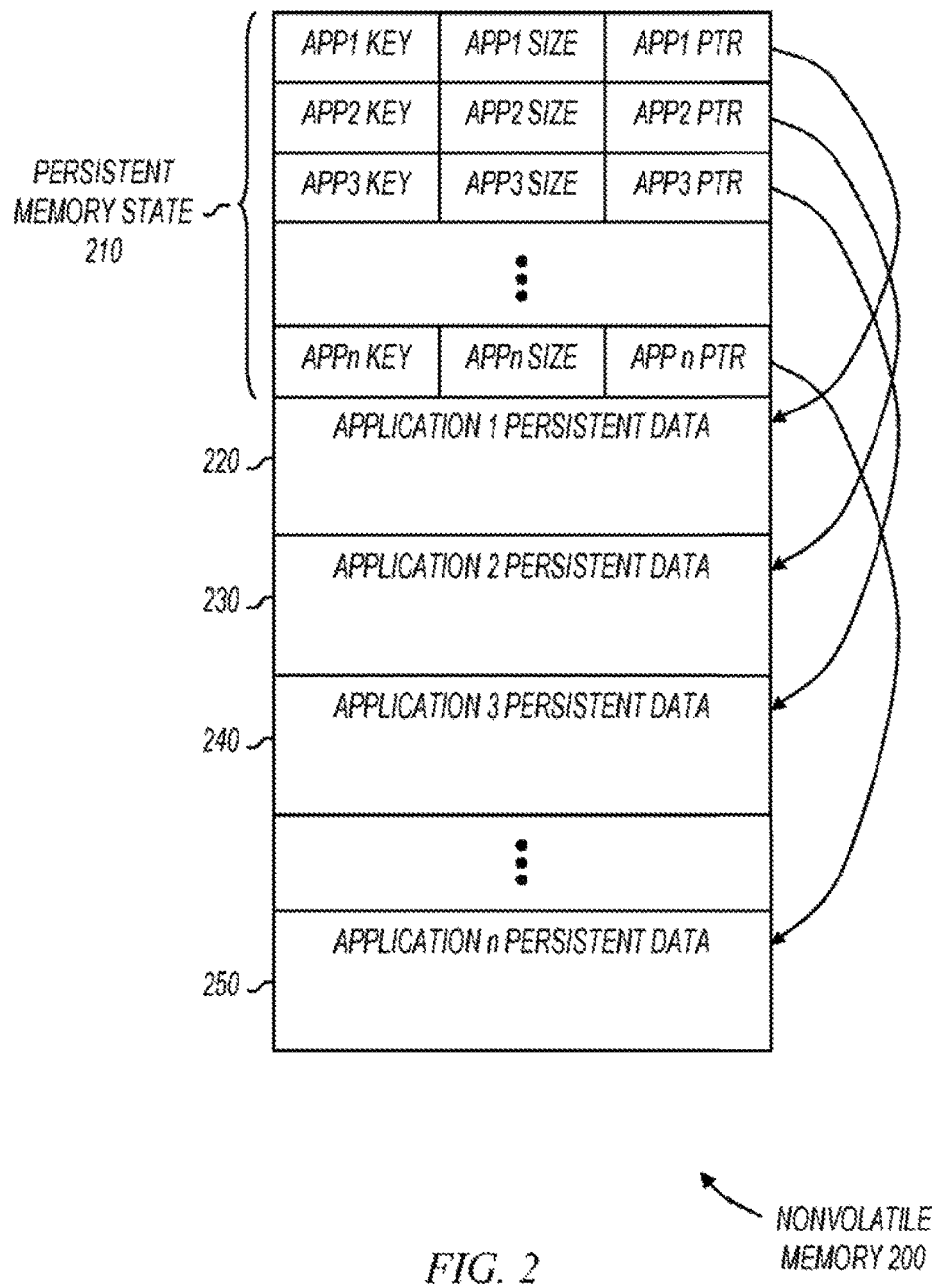
FIG. 2 shows persistent data storage in nonvolatile memory in accordance with various embodiments of the invention.

FIG. 2 shows persistent data storage in nonvolatile memory in accordance with various embodiments of the invention. Nonvolatile memory 200 may be any type of nonvolatile memory. For example, in some embodiments, memory 200 is PCM memory, and in other embodiments, memory 200 is FLASH memory.

Nonvolatile memory 200 includes persistent data storage for any number of applications, shown as "n" in FIG. 2. A first application (Application 1) has persistent data stored at 220, a second application (Application 2) has persistent data stored at 230, and a third application (Application 3) has persistent data storage at 240. The n.sup.th application has persistent data storage at 250. Nonvolatile memory 200 also includes a data structure describing the persistent memory state 210. For each application with persistent data storage, persistent memory state 210 includes a record that includes at least three fields: a key, a size, and a pointer. For example, the persistent memory state record for application 1 includes App 1 key, App 1 size, and App 1 ptr. App 1 key is a unique identifier that allows Application 1 to be associated with the persistent storage at 220. App 1 size is the size of the persistent storage at 220. App 1 ptr is a pointer that points to the persistent storage at 220.

In operation, an application can request persistent storage. When persistent storage is first requested, a persistent storage block (e.g., 220) is allocated, and a record is added to persistent memory state 210 to associate the persistent memory block with the requesting application. If the application already has persistent storage, then the appropriate record in persistent memory state 210 is found, and the application can access the persistent storage through the pointer.

In some embodiments, an application programming interface (API) is provided to allow applications to request persistent data storage. For example, a nonvolatile memory allocation routine may be provided that accepts a key and a size and returns a pointer. This nonvolatile memory allocation routine may take the following form:

ptr=nvmalloc(size,key)

where the calling application provides the key and the size, and the API returns the pointer. Each application has a unique key that it uses when requesting persistent storage. The application passes the unique key and the desired size of the persistent storage to the nvmalloc routine, and the nvmalloc routine returns a pointer to the persistent storage. If the calling application does not yet have a persistent storage area, then one is allocated, and a pointer to the newly allocated persistent storage area is returned. If the calling application does have a persistent storage area (e.g., when an application is being run subsequent to a previous call to nvmalloc), then the existence of the persistent storage is verified and the pointer is returned.

In various embodiments of the invention, an application can choose to store some data in persistent storage, and some data elsewhere. In some embodiments, a call to nvmalloc forces the system to use nonvolatile memory whereas a call to a different memory allocation routine (e.g., malloc) allows the system to determine where to provide storage. Providing this level of control to applications allows the applications to store an d access data with the knowledge that this data will be accessible from one instantiation to another, and also across power events.

Although the return value (ptr) is described above as a pointer, this is a limitation of the present invention. Any type of reference may be returned or updated to provide access to allocated persistent storage. For example, an object of a different type may be returned. Also for example, in some embodiments, an application may pass a local, global, or static variable along with the size request, and the Variable may be updated with a reference to the allocated persistent storage.

Figure 3:
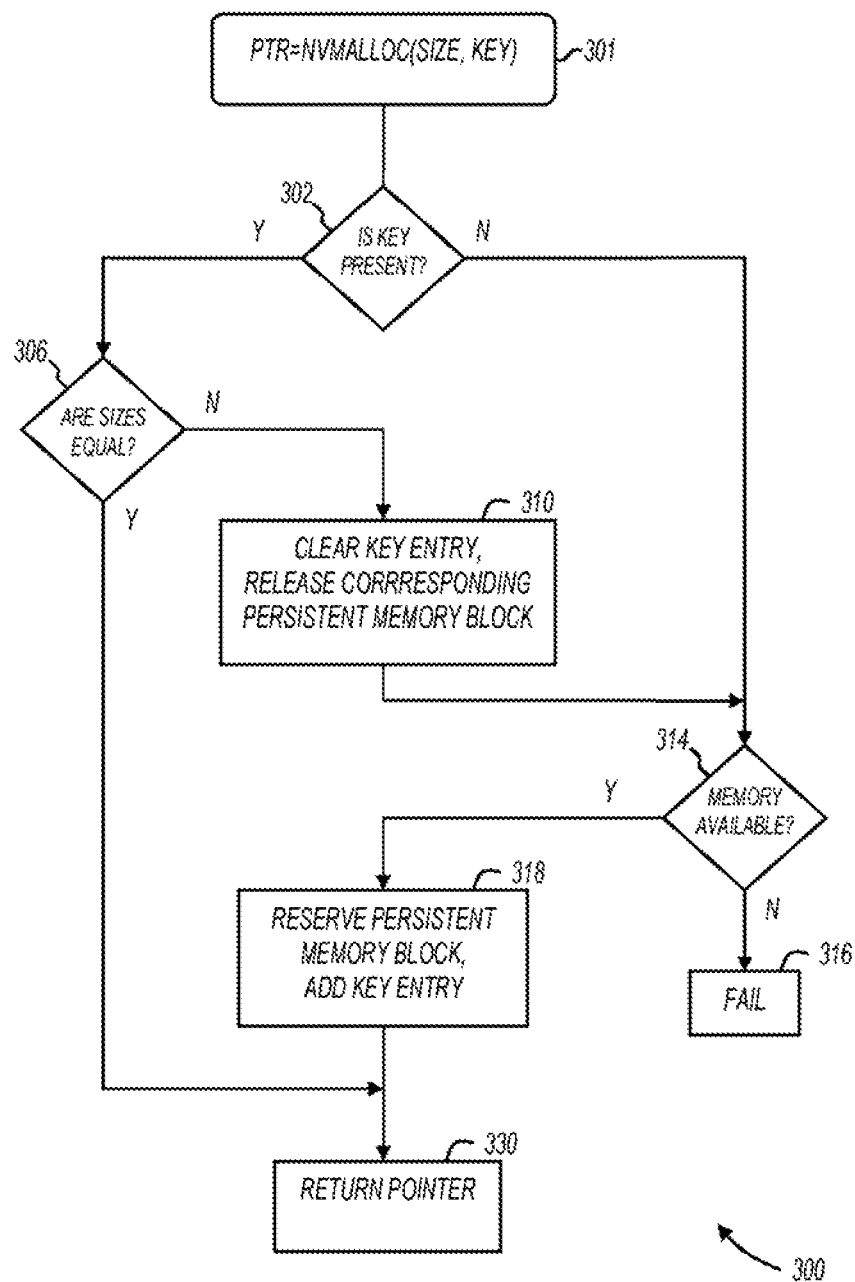
FIG. 3 shows a flow diagram in accordance with various embodiments of the present invention.

FIG. 3 shows a flow diagram in accordance with various embodiments of the invention. In some embodiments, method 300, or portions thereof, is performed by a processor executing software that manages persistent data storage in nonvolatile memory. For example, method 300 may represent the nvmalloc routine described above with reference to FIG. 2. Method 300 is not limited by the particular type of apparatus performing the method. The various actions in method 300 may be performed in the order presented, or may be performed in a different order. Further, in some embodiments, some actions listed in FIG. 3 are omitted from method 300.

Method 300 is shown being invoked at 301 as ptr=nvmalloc(size, key). It should be understood that the term "nvmalloc" is provided as a convenient label for the purpose of explanation, and that embodiments of method 300 may be referred to using any suitable label or name. Likewise, it should be understood that the passed parameters are not necessarily limited to a size and a key. Any number or type of parameters may be passed by an application requesting persistent memory. Further, method 300 is shown returning a pointer to the persistent memory, although this is not a limitation of the present invention. Any suitable mechanism for referencing the persistent memory may be utilized. For example, the calling application may receive a persistent object from method 300 to point to the persistent memory.

At 302, method 300 examines the key provided by the calling application to determine if the key is present. This corresponds to determining if one of the key entries in persistent memory state 210 (FIG. 2) includes the key. If the key is not present, then the calling application does not currently have persistent memory allocated. In this case, method 300 continues at 314 to determine if enough nonvolatile memory is available to satisfy the size request. If not, then method 300 ends at 316 and the persistent memory request fails. In some embodiments, this may result in the nvmalloc routine returning a null pointer or otherwise informing the calling application of the failure.

If method 300 determines that memory is available at 314, then a persistent memory block is reserved and a key entry is added at 318. This corresponds to a nonvolatile block of memory (e.g., 220, FIG. 2) being reserved, and a key entry being added to persistent memory state 210. The key entry includes the unique key, the size of the memory block, and a pointer to the memory block. At 330, the pointer to the memory block is returned to the calling application.

If at 302, method 300 determines that the key is already present in a key entry in persistent memory state 210, then the sizes are compared at 306. The site parameter passed from the calling routine is compared to the site stored in the key entry. If they are different, then there is a mismatch in size between the currently allocated persistent memory and the size expected by the calling application. The response is to clear the existing key entry and release the corresponding persistent memory block at 310. The method then continues at 314 to allocate a new persistent memory block as described in the previous paragraphs.

The persistent memory allocation described above with reference to FIGS. 2 and 3 may exist in systems with or without virtual memory. For example, in some embodiments, a system 100 (FIG. 1) that includes a memory management unit 130 may implement persistent memory in accordance with FIGS. 2 and 3. Further, in other embodiments, a system 100 (FIG. 1) that does not include a memory management unit 130 may implement persistent memory in accordance with FIGS. 2 and 3.

In contrast, the persistent memory allocation described below with reference to FIGS. 4-6 exists in systems that are able to manage memory in the background. For example, a system 100 (FIG. 1) that includes a memory management unit 130 may implement persistent memory in accordance with FIGS. 4-6.

Figure 4:
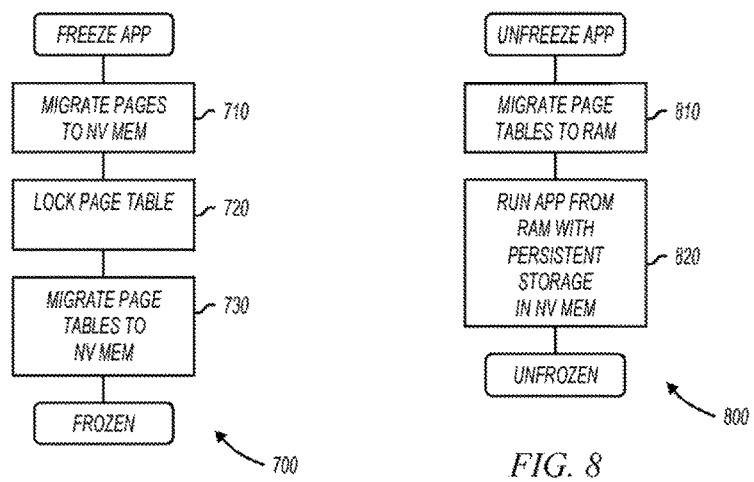
FIG. 4 shows the state of persistent data storage in accordance with various embodiments of the invention.

FIG. 4 shows the state of persistent storage in nonvolatile memory in accordance with various embodiments of the invention. Persistent memory state 410 is maintained in nonvolatile memory. The persistent storage that corresponds to entries in persistent memory state 410 is not shown in FIG. 400, because it may be maintained in one or more locations in either or both of volatile and/or nonvolatile memory as described further below.

Persistent memory state 410 is a data structure that includes a record for each allocated persistent memory block. Persistent memory state 410 may maintain records for any number of applications, shown as "n" in FIG. 4. For each application with persistent data storage, persistent memory state 410 includes a record that includes at least four Fields: a key, a size, a persistence qualifier, and a pointer. For example, the persistent memory state record for application 1 includes App 1 key, App 1 size, App 1 pqual, and App 1 ptr. App 1 key is a unique identifier that allows Application 1 to be associated with its allocated persistent storage. App 1 size is the size of the persistent storage. App 1 pqual is a persistence qualifier that provides guidance to the system on how to manage the persistent storage. And App 1 ptr is a pointer that points to the persistent storage.

In operation, an application can request persistent storage with a particular persistence qualifier. When persistent storage is first requested, a persistent storage block is allocated, and a record is added to persistent memory state 410 to associate the persistent memory block with the requesting application. If the application already has persistent storage, then the appropriate record in persistent memory state 410 is found, and the application can access the persistent storage through the pointer.

In some embodiments, an application programming interface (API) is provided to allow applications to request persistent data storage with a persistence qualifier. For example, a nonvolatile memory allocation routine may be provided that accepts a key, a size, and a persistence qualifier, and returns a pointer. This nonvolatile memory allocation routine may take the following form:

```
ptr-nvmalloc(size,key,persistence qualifier)
``` where the calling application provides the key, the size, and the persistence qualifier; and the API returns the pointer. Each application has a unique key that it uses when requesting persistent storage. The application passes the unique key and the desired size of the persistent storage along with the persistence qualifier to the nvmalloc routine, and the nvmalloc routine returns a pointer to the persistent storage. If the calling application does not yet have a persistent storage area, then one is allocated, and a pointer to the newly allocated persistent storage area is returned. If the calling application does have a persistent storage area (e.g., when an application is being run subsequent to a previous call to nvmalloc), then the existence of the persistent storage is verified and the pointer is returned.

The persistence qualifier is used to specify the type or "degree" of persistence that is desired by the calling application. These persistence qualifiers are interpreted by systems with memory management units when determining how to manage persistent memory. For example, and not by way of limitation, valid persistence qualifiers may include DIRECTIO; WRITEBACK; WRITETHROUGH; and ATOMIC.

The DIRECTIO persistence qualifier directs the system to read and write directly to the persistent storage in nonvolatile memory. Neither read nor write caches are maintained in volatile memory.

The WRITEBACK persistence qualifier directs the system to write to volatile memory and then migrate the data to nonvolatile memory as time permits. Both read and write caches may be maintained in volatile memory.

The WRITETHROUGH persistence qualifier directs the system to write to both volatile and nonvolatile memory. Read caches may be maintained, but write caches are not because writes are always made to the nonvolatile memory. Examples of persistent memory blocks with different persistence qualifiers are described with reference to later figures.

The ATOMIC persistence qualifier directs the system to write to volatile memory until a command is given to flush it down, such as from a special API, such as sync(key). When the system receives such a command it updates the nonvolatile memory object referenced by 'key' as an atomic unit. If the data fails to write to the nonvolatile memory in its entirety the system will revert the object to its state before the write started.

Figure 5:
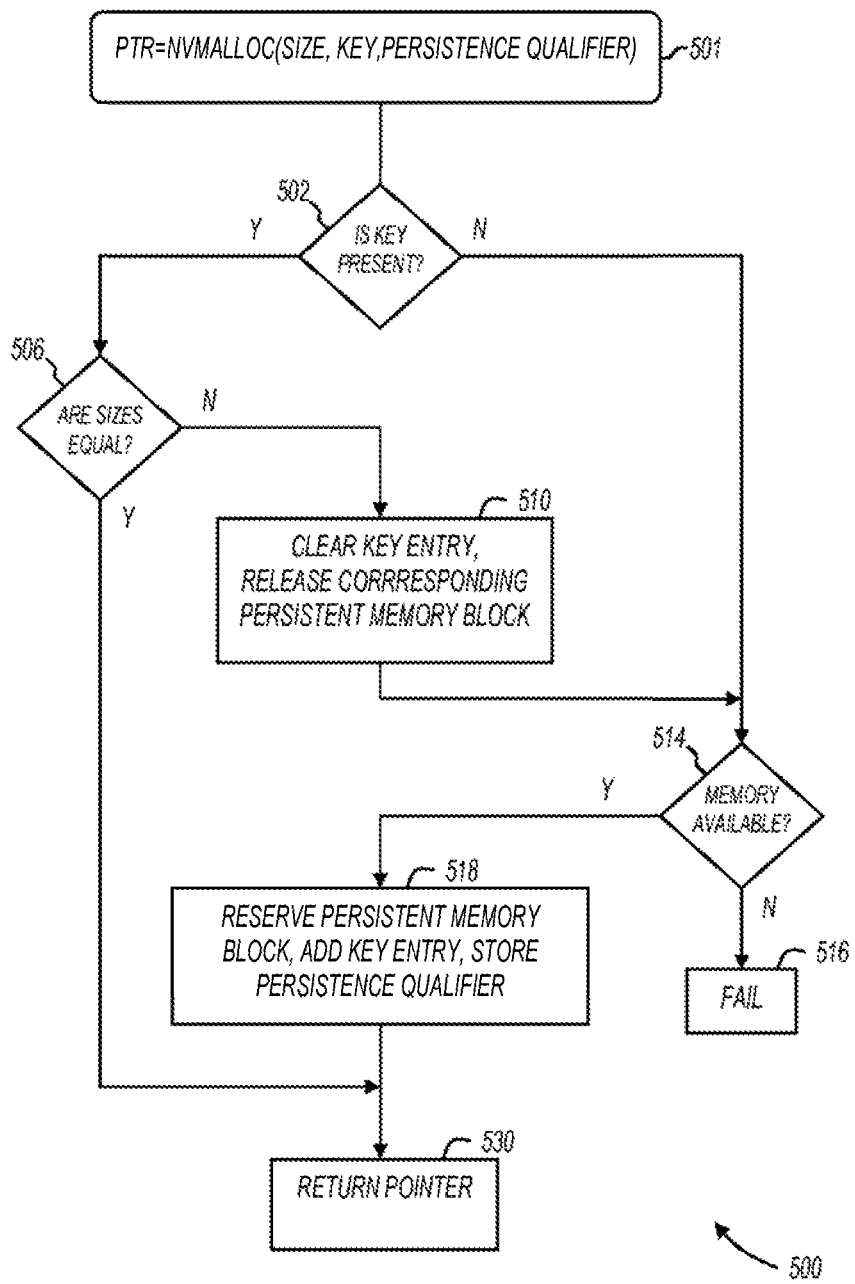
FIG. 5 shows a flow diagram in accordance with various embodiments of the present invention.

FIG. 5 shows a flow diagram in accordance with various embodiments of the present invention. In some embodiments, method 500, or portions thereof, is performed by a processor executing software that manages persistent data storage in nonvolatile memory. Method 500 is not limited by the particular type of apparatus performing the method. The various actions in method 500 may be performed in the order presented, or may be performed in a different order. Further, in some embodiments, some actions listed in FIG. 5 are omitted from method 500.

Method 500 is shown beginning at 501 with a call to an nvmalloc routine. This nvmalloc routine is similar to the nvmalloc routine described above with reference to FIGS. 2 and 3 with the exception that a persistence qualifier is passed from the calling program.

At 502, method 500 examines the key provided by the calling application to determine if the key is present. This corresponds to determining if one of the key entries in persistent memory state 410 (FIG. 4) includes the key. If the key is not present, then the calling application does not currently have persistent memory allocated. In this case, method 500 continues at 514 to determine if enough nonvolatile memory is available to satisfy the size request. If not, then method 500 ends at 516 and the persistent memory request fails. In some embodiments, this may result in the nvmalloc routine returning a null pointer or otherwise informing the calling application of the failure.

If method 500 determines that memory is available at 514, then a persistent memory block is reserved and a key entry is added at 518. This corresponds to a nonvolatile block of memory being reserved, and a key entry being added to persistent memory state 410. The key entry includes the unique key, the size of the memory block, the persistence qualifier, and a pointer to the memory block. At 530, the pointer to the memory block is returned to the calling application.

If at 502, method 500 determines that the key is already present in a key entry in persistent memory state 410, then the sizes are compared at 506. The size parameter passed from the calling routine is compared to the size stored in the key entry. If they are different, then there is a mismatch in size between the currently allocated persistent memory and the size expected by the calling application. The response is to clear the existing key entry and release the corresponding persistent memory block at 510. The method then continues at 514 to allocate a new persistent memory block as described in the previous paragraphs.

Figure 6:
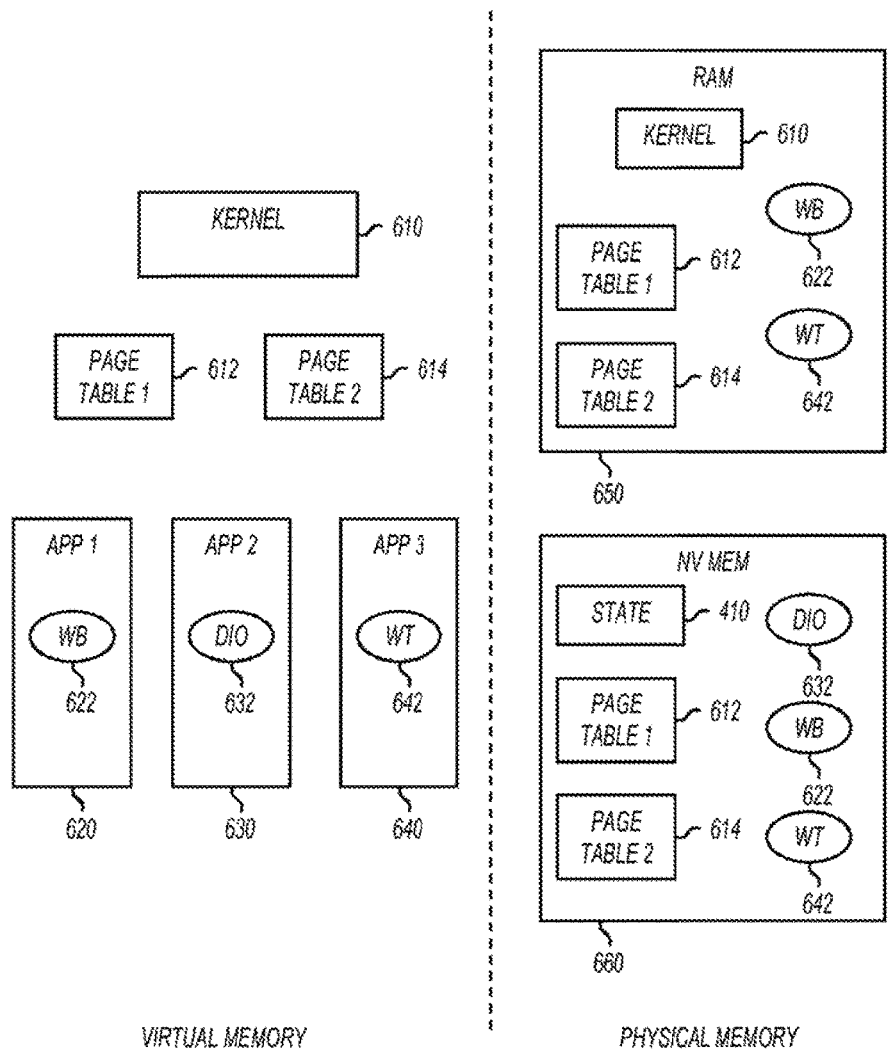
FIG. 6 shows contents of virtual and physical memory in accordance with various embodiments of the present invention.

FIG. 6 shows contents of virtual and physical memory in accordance with various embodiments of the present invention. The left side of FIG. 6 shows an operating system kernel 610, page tables 612, 614, and three applications 620, 630, and 640, each with allocated persistent memory 622, 632, and 642. The left side is labeled "virtual memory" because there is no distinction between what type of memory each block is held in. This is invisible to the applications, as it is handled by the memory management unit.

Application 620 (APP1) has persistent storage 622 allocated as WRITEBACK (WB); application 630 (APP2) has persistent storage 632 allocated as DIRECTIO (DIO); and application 640 (APP4) has persistent storage 642 allocated as WRITETHROUGH (WT). This corresponds to a system with a persistent memory state 410 (FIG. 4) in which the persistence qualifiers for the first three applications are set to WRITEBACK, DIRECTIO, and WRITETHROUGH, respectively.

The right side of FIG. 6 shows how the various items are stored in physical memory. Kernel 610 is typically in volatile memory 650 (e.g., RAM) as shown, although this is not a limitation of the present invention. Persistent memory state 410 is stored in nonvolatile memory 660. Because the persistent memory state 410 is stored in nonvolatile memory, the state is persistent across power events and application instantiations.

The persistent storage blocks requested by, and allocated to, the applications are stored in one or both of the volatile and/or nonvolatile memory as follows. Application 620 requested persistent storage with a persistence qualifier of WRITEBACK. As a result, writes are performed to volatile memory 650, and the memory manager copies it from volatile memory 650 to nonvolatile memory 660 as time permits. Accordingly, persistent storage 622 is shown in both volatile memory 650 and nonvolatile memory 660. Application 630 requested persistent storage with a persistence qualifier of DIRECTIO. As a result, writes are performed directly to nonvolatile memory 660. Accordingly, persistent storage 632 is shown only in nonvolatile memory 660. Application 640 requested persistent storage with a persistence qualifier of WRITETHROUGH. As a result, writes are always performed to both volatile memory 650 and nonvolatile memory 660. Accordingly, persistent storage 642 is shown in both volatile memory 650 and nonvolatile memory 660.

Page tables 612 and 614 are shown in both volatile memory 650 and nonvolatile memory 660, although this is not a limitation of the present invention. For example, page tables may be in only of volatile memory 650 or nonvolatile memory 660.

In some embodiments, page tables are maintained in volatile memory while applications are running, and are migrated to nonvolatile memory when the application is frozen. For example, an application on a mobile phone may go dormant through non-use. The application can be shut down so that it requires a complete restart the next time it is used, or the application can be frozen so that it can be quickly revived when next used.

FIGS. 7 and 8 show flow diagrams in accordance with various embodiments of the present invention. Method 700 shows that an application with persistent storage can be frozen by migration of page tables. At 710, any pages of persistent storage that are not already in nonvolatile memory are migrated to nonvolatile memory. For example, persistence storage with a persistence qualifier of WRITEBACK may have pages in volatile memory. These pages are migrated to nonvolatile memory at 710. At 720, the page tables are locked. At this point, the page tables reference only pages in nonvolatile memory, and the page tables are locked so that they cannot be modified. At 730, the locked page tables are migrated to nonvolatile memory. After 730, all persistent storage and associated page tables are resident in nonvolatile memory, and the application can be considered frozen. Power can be turned off and no persistent dam will be lost.

Method 800 shows that the same application can be revived, or "unfrozen." At 810, the page tables are migrated back to volatile memory, and at 820, the application is run from volatile memory while the persistent storage is left in nonvolatile memory. This is possible because the page tables were updated to reference the persistent storage in nonvolatile memory before they were migrated to nonvolatile memory themselves.

In some embodiments, page tables are not migrated back to volatile memory. For example, at 820, the application may be run in volatile memory while the both the page tables and the persistent storage is left in nonvolatile memory.

Unless specifically stated otherwise, as apparent from the preceding discussions, it is appreciated that throughout the specification discussions utilizing terms such as "monitoring," "storing," "detecting," "using," "identifying," "marking," "receiving," "loading," "reconfiguring," "formatting," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

Various general purpose systems may be used with programs in accordance with the teachings term, ear it t ray prove convenient to construct a more specialized apparatus to perform the desired method. The desired structure for a variety of these systems appears in the description above. In addition, embodiments of the invention are not described with reference to any particular programming language. A variety of programming languages may be used to implement the teachings of the invention as described herein. In addition, it should be understood that operations, capabilities, and features described herein may be implemented with any combination of hardware (discrete or integrated circuits) and software.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A method comprising:
   initiating an operation to freeze an application;
   responsive to initiating the operation to freeze the application, migrating one or more pages of persistent storage from a volatile memory to a nonvolatile memory;
   locking one or more page tables such that entries in the page tables refer only to pages of persistent storage in the nonvolatile memory; and
   migrating the one or more frozen page tables to the nonvolatile memory.

2. The method of claim 1, wherein migrating the one or more pages of persistent storage comprises migrating only those pages of persistent storage not already stored in the nonvolatile memory.

3. The method of claim 1, further comprising:
   receiving an instruction to unfreeze the application;
   responsive to receiving the instruction to unfreeze the application, migrating the one or more page tables to the volatile memory; and
   executing the application from the volatile memory while maintaining the one or more pages of persistent storage in the nonvolatile memory.

4. The method of claim 1, further comprising:
   receiving an instruction to unfreeze the application;
   executing the application from the volatile memory while maintaining the one or more page tables and the one or more pages of persistent storage in the nonvolatile memory.

5. The method of claim 1, wherein locking the one or more page tables comprises configuring the one or more page tables such that the one or more page tables cannot be modified.

6. A method comprising:
   storing an application having a portion of persistent memory allocated thereto in a virtual memory space, wherein the portion of persistent memory is associated with a persistence qualifier indicative of a type of persistence assigned to the portion of persistent memory;
   responsive to initiating an operation to freeze the application, migrating the portion of persistent memory from a volatile memory to a nonvolatile memory, wherein the nonvolatile memory comprises a physical memory space;
   locking one or more page tables such that entries in the page tables refer only to pages of persistent memory in the nonvolatile memory; and
   migrating the one or more frozen page tables to the nonvolatile memory.

7. The method of claim 6, further comprising storing the portion of persistent memory in a volatile memory of the physical memory space.

8. The method of claim 7, further comprising indicating, via the persistence qualifier, that the portion of persistent memory has a write back type of persistence.

9. The method of claim 8, wherein writing data to the portion of persistent storage includes writing the data to the volatile memory at a first time and writing the data to the nonvolatile memory at a second time.

10. The method of claim 7, further comprising indicating, via the persistence qualifier, that the portion of persistent memory has a write through type of persistence.

11. The method of claim 10, wherein writing the data to the portion of the persistent storage includes writing the data to the volatile memory and the nonvolatile memory as a single operation.

12. The method of claim 6, further comprising indicating, via the persistence qualifier, that the portion of persistent memory has a direct input/output type of persistence.

13. The method of claim 6, further comprising storing a data structure on the nonvolatile memory, wherein the data structure stores an application key associated with the application, a size of the portion of persistent memory; and a pointer to a location of the portion of persistent memory in the nonvolatile memory.

14. A method comprising:
   storing one or more applications in a virtual memory space, wherein each of the one or more applications has allocated thereto a respective portion of persistent memory having an associated persistence qualifier indicative of a type of persistence;
   responsive to initiating an operation to freeze at least one of the one or more applications, migrating the respective portion of persistent memory to a nonvolatile memory, wherein the nonvolatile memory comprises a physical memory space;
   locking one or more page tables such that entries in the page tables refer only to pages of persistent memory in the nonvolatile memory; and
   migrating, via a processor, the one or more frozen page tables to the nonvolatile memory.

15. The apparatus of claim 14, further comprising storing one or more of the respective portions of persistent memory in a volatile memory based on the persistence qualifier.

16. The method of claim 15, further comprising storing one or more page tables in the volatile memory, wherein the one or more page tables comprise a data structure associating the one or more applications with a respective associated persistence qualifier.

17. The method of claim 16, further comprising migrating, via the processor, the one or more page tables from the volatile memory to the nonvolatile memory responsive to an instruction to freeze the one or more applications.

18. The method of claim 17, further comprising migrating, via the processor, the one or more page tables from the nonvolatile memory to the volatile memory responsive to an instruction to unfreeze the one or more applications.

19. The method of claim 18, further comprising executing, via the processor, the one or more applications from the virtual memory space while maintaining the portions of the persistent memory in the nonvolatile memory.

20. The method of claim 16, further comprising executing, via the processor, the one or more applications from the virtual memory space while maintaining the one or more page tables and the portions of the persistent memory in the nonvolatile memory.

* * * * *